(12) United States Patent
Jantscher et al.

(10) Patent No.: US 10,347,491 B2
(45) Date of Patent: Jul. 9, 2019

(54) FORMING RECOMBINATION CENTERS IN A SEMICONDUCTOR DEVICE

(71) Applicant: Infineon Technologies Austria AG, Villach (AT)

(72) Inventors: Wolfgang Jantscher, Villach (AT); Alexander Binter, Villach (AT); Oliver Blank, Villach (AT); Petra Fischer, Wernberg (AT); Ravi Keshav Joshi, Klagenfurt (AT); Kurt Pekoll, Villach (AT); Manfred Pippan, Noetsch (AT); Andreas Riegler, Lichtpold (AT); Werner Schustereder, Villach (AT); Juergen Steinbrenner, Noetsch (AT); Waqas Mumtaz Syed, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 15/850,041

(22) Filed: Dec. 21, 2017

(65) Prior Publication Data
US 2018/0182629 A1 Jun. 28, 2018

(30) Foreign Application Priority Data
Dec. 22, 2016 (DE) .................. 10 2016 125 316

(51) Int. Cl.
| H01L 21/266 | (2006.01) |
| H01L 21/324 | (2006.01) |
| H01L 29/66  | (2006.01) |
| H01L 21/308 | (2006.01) |
| H01L 21/768 | (2006.01) |

(Continued)

(52) U.S. Cl.
CPC .......... *H01L 21/266* (2013.01); *H01L 21/308* (2013.01); *H01L 21/324* (2013.01); *H01L 21/76847* (2013.01); *H01L 29/404* (2013.01); *H01L 29/6634* (2013.01); *H01L 29/66333* (2013.01); *H01L 29/66712* (2013.01); *H01L 29/7396* (2013.01); *H01L 29/0619* (2013.01); *H01L 29/0634* (2013.01); *H01L 29/0696* (2013.01)

(58) Field of Classification Search
CPC ............... H01L 29/6634; H01L 21/324; H01L 29/66333; H01L 29/66712
See application file for complete search history.

(56) References Cited

U.S. PATENT DOCUMENTS

| 2013/0341674 A1 | 12/2013 | Werber et al. |
| 2014/0374882 A1* | 12/2014 | Siemieniec ........... H01L 21/324 257/618 |
| 2016/0307993 A1* | 10/2016 | Kuribayashi ........... H01L 29/47 |

* cited by examiner

*Primary Examiner* — Mohammed R Alam
(74) *Attorney, Agent, or Firm* — Murphy, Bilak & Homiller, PLLC

(57) ABSTRACT

Disclosed is a method. The method includes implanting recombination center particles into a semiconductor body via at least one contact hole in an insulation layer formed on top of the semiconductor body, forming a contact electrode electrically connected to the semiconductor body in the at least one contact hole, and annealing the semiconductor body to diffuse the recombination center particles in the semiconductor body. Forming the contact electrode includes forming a barrier layer on sections of the semiconductor body uncovered in the at least one contact hole, wherein the barrier layer is configured to inhibit the recombination center particles from diffusing out of the semiconductor body.

20 Claims, 6 Drawing Sheets

(51) Int. Cl.
*H01L 29/40* (2006.01)
*H01L 29/739* (2006.01)
*H01L 29/06* (2006.01)

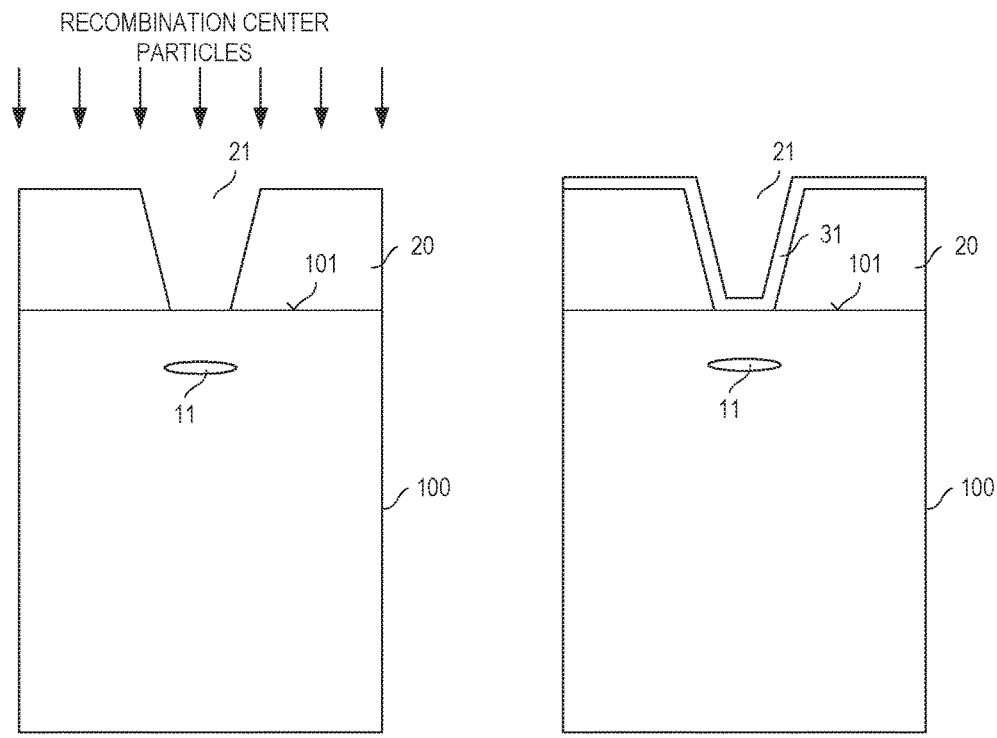
FIG 1A
FIG 1B
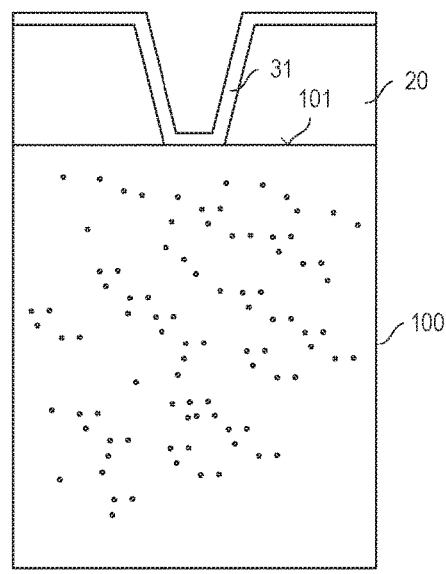
FIG 1C
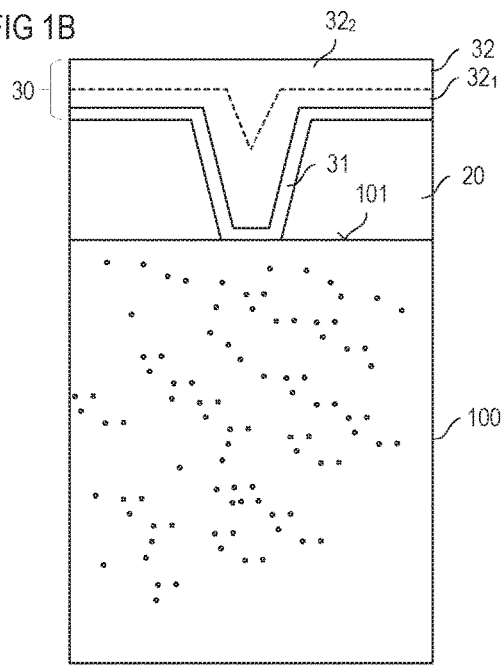
FIG 1D

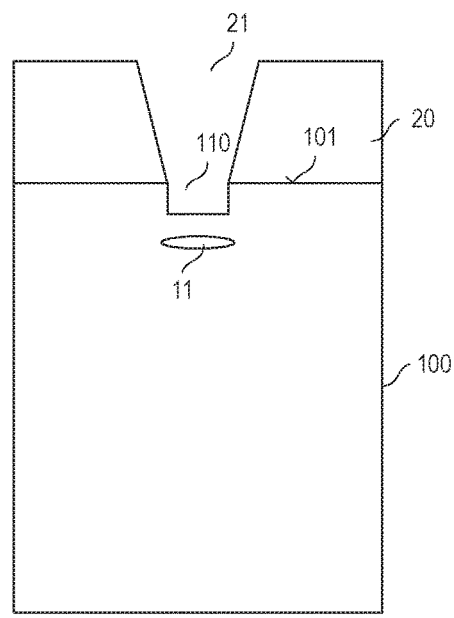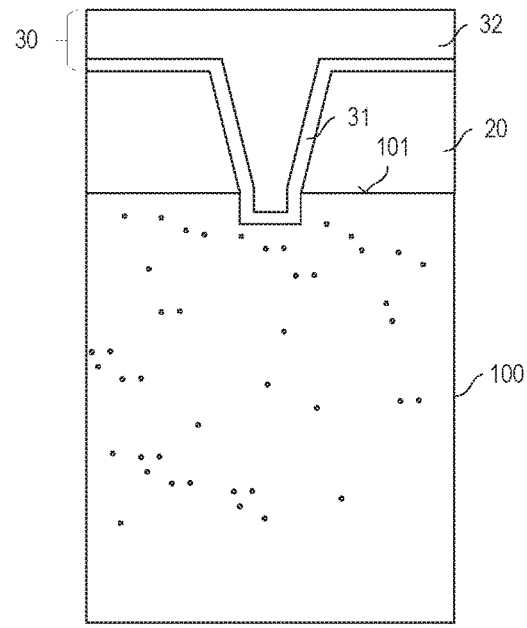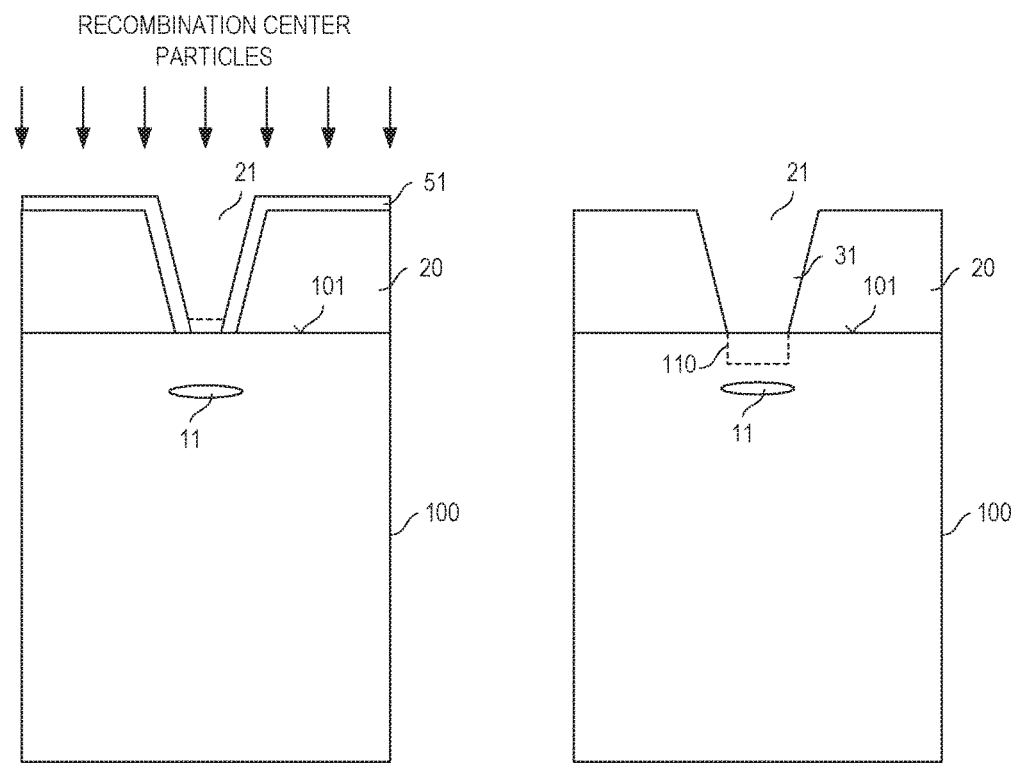

FORMING RECOMBINATION CENTERS IN A SEMICONDUCTOR DEVICE

BACKGROUND

Power semiconductor device such as power MOSFETs (Metal Oxide Field-Effect Transistors), power IGBTs (Insulated Gate Bipolar Transistors), power diodes or power thyristors are widely used in industrial, automotive, household, or consumer electronic applications. A power semiconductor device includes a drift region (which may also be referred to as base region) that mainly defines a voltage blocking capability of the semiconductor device. A power semiconductor device may be operated in a bipolar conduction mode in which there is a charge carrier plasma with charge carriers of one type (electrons or holes) and charge carriers of a complementary type in the drift region. A MOSFET, for example, is in the bipolar conduction state when an internal body diode formed by the drift region and an adjoining body region is forward biased and conducting. The charge carrier plasma is removed when the device changes from the bipolar conducting state to the blocking state. A time duration it takes for this charge carrier plasma to be removed, that is, a time duration it takes for the device to change from the bipolar conducting state to a blocking state is dependent on a concentration of charge carriers that form the plasma.

The charge carrier concentration and, therefore, the characteristic of the semiconductor device when changing from the bipolar conducting state to the blocking state can be adjusted by forming recombination centers in the drift region. These recombination centers promote a recombination of electrons and holes in the drift and, therefore, help to adjust the plasma concentration. Forming recombination centers may include introducing recombination center atoms, such as platinum atoms, into the drift region during a manufacturing process of the semiconductor device. Some of these recombination center atoms, however, may diffuse out of the semiconductor body during a subsequent processing and may contaminate processing equipment.

There is therefore a need for producing recombination centers in a semiconductor device while reducing a risk of contamination of processing equipment.

SUMMARY

One example relates to a method. The method includes implanting recombination center particles into a semiconductor body via at least one contact hole in an insulation layer formed on top of the semiconductor body, forming a contact electrode electrically connected to the semiconductor body in the at least one contact hole, and annealing the semiconductor body to diffuse the recombination center particles in the semiconductor body. Forming the contact electrode includes forming a barrier layer on sections of the semiconductor body uncovered in the at least one contact hole, wherein the barrier layer is configured to inhibit recombination center particles from diffusing out of the semiconductor body.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIGS. 1A to 1D show one example of a method for forming recombination centers in a semiconductor body;

FIGS. 2A to 2B illustrate a modification of the method illustrated in FIGS. 1A to 1B;

FIGS. 3A to 3B illustrate another modification of the method illustrated in FIGS. 1A to 1D;

DETAILED DESCRIPTION

Figure 4A:
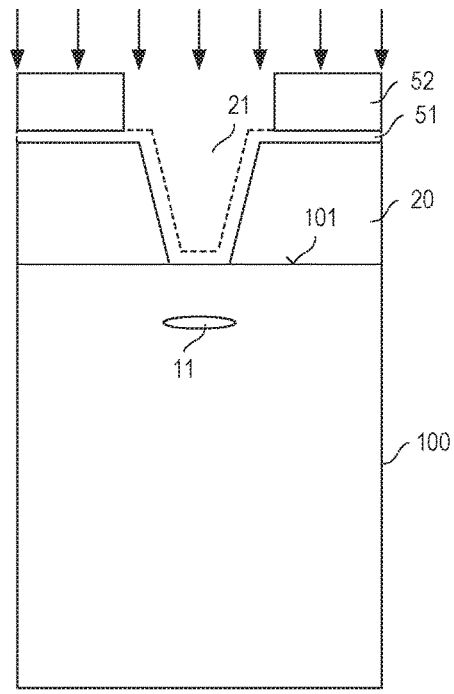
FIGS. 4A to 4B illustrate yet another modification of the method illustrated in FIGS. 1A to 1D.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIGS. 1A to 1D illustrate one example of a method for forming recombination centers in a semiconductor body 100 and for forming a contact plug 30 electrically connected to the semiconductor body 100. Each of FIGS. 1A to 1D shows a vertical cross-sectional view of one section of the semiconductor body 100. The semiconductor body 100 has a first surface 101. Each of FIGS. 1A to 1D shows the semiconductor body 100 in a section plane perpendicular to the first surface 101. The semiconductor body 100 may include a conventional semiconductor material such as silicon (Si), silicon carbide (SiC), gallium arsenide (GaAs), gallium nitride (GaN), or the like.

Referring to FIG. 1A, the semiconductor body 100 is part of a semiconductor arrangement which, besides the semiconductor body 100, includes an insulation layer 20 on top of the first surface 101. The insulation layer 20 includes an electrically insulating material such as an oxide, a nitride, or the like. According to one example, the insulation layer 20 includes only one type of material such as an oxide or a nitride. According to another example (not explicitly shown in FIGS. 1A to 1D) the insulation layer 20 includes a layer stack with at least two layers of different types of material. A conductor (not shown in FIGS. 1A to 1D) such as a gate electrode of a transistor device may be embedded in the insulation layer 20. This is explained with reference to examples herein further below.

Referring to FIG. 1A, the insulation layer 20 includes a contact hole (contact opening) 21. In the example shown in FIG. 1A, this contact hole 21 extends down to the first surface 101 of the semiconductor body 100 so that at a bottom of the contact hole 21 a section of the first surface 101 of the semiconductor body 100 is uncovered. Forming recombination centers in the semiconductor body 100 includes implanting recombination center particles via the contact hole 21 into the semiconductor body 100. A region in the semiconductor body 100 in which the implanted recombination center particles come to rest is schematically illustrated and labelled with reference character 11 in FIG. 1A. This region can be referred to as end-of-range region of the implantation. How far the end-of-range region 11 is spaced apart from the first surface 101 is dependent on an implantation energy and the type of recombination center particles used in the method. Examples of recombination center particles include, but are not restricted to, atoms or ions selected from the following chemical elements: platinum (Pt), gold (Au), palladium (Pd), iridium (Ir), silver (Ag), copper (Cu), mercury (Hg), or rhenium (Re). Of course, atoms of more than one of these different chemical elements may be implanted.

In sections of the first surface 101 covered by the insulation layer 20, the insulation layer 20 essentially prevents recombination center particles from being implanted into the semiconductor body 100.

Referring to FIG. 1B, forming the contact plug (which may also be referred to as contact electrode) includes forming an electrically conducting barrier layer 31 at least on those regions of the semiconductor body 100 uncovered by the insulation layer 20. The barrier layer 31 is configured to inhibit or inhibit as far as possible recombination center particles from diffusing out of the semiconductor body 100 via the first surface 101. According to one example, the barrier layer 31 is not only formed on the first surface 101 but covers the insulation layer 20 at least on sidewalls of the contact hole 21. In the example shown in FIG. 1B, the barrier layer 31 covers the semiconductor body 100 at the bottom of the contact hole 21, the sidewalls of the contact hole 21, and a surface of the insulation layer 20 opposite the first surface 101 of the semiconductor body 100.

According to one example, the barrier layer includes only one type of material. Examples of this type of material include, but are not restricted to, titanium (Ti), titanium nitride (TiN), tantalum (Ta), tantalum nitride (TaN), titanium tungsten alloy (TiW), titanium tungsten nitride (TiWN). According to another example, the barrier layer 31 includes a layer stack with two or more sub-layers of different types of materials. According to one example, the barrier layers 31 includes a metal layer such as a Ti layer, a Ta layer or a TiW layer as a first sublayer that is formed in direct contact with the semiconductor body 100 and the insulation layer 20, and a nitride layer such as a TiN layer or a TaN layer as a second sublayer formed on the metal layer. According to one example, forming both the metal layer and the nitride layer of the layer stack includes a deposition process, A deposition process as used herein may be a physical deposition process such as a sputter deposition process or a chemical deposition process such as a chemical vapor deposition (CVD) process. According to another example, forming the layer stack comprises forming the metal layer by a deposition process and annealing the metal layer in a nitrogen containing atmosphere such as a gaseous ammonia ($NH_3$) containing atmosphere so that a section of the metal layer is transformed into a nitride layer. 200° C., Wolfram 450° C. AlCu 350° C., Pt-Diffusion ab 700-750° C.

Referring to FIG. 1C, the method further includes annealing the semiconductor body 100 to cause the implanted recombination center particles to diffuse in the semiconductor body 100. After the diffusion process, the recombination center particles are distributed over the semiconductor body 100 where they form recombination centers. These recombination centers are schematically illustrated by circles in FIG. 1C. According to one example, the annealing process is a rapid thermal annealing (RTA) process. A temperature in this annealing process may be selected from a range of between 700° C.; and 1200° C., in particular between 900° C. and 1100° C., and a duration of this annealing process may be selected from a range of between 30 seconds and several minutes, in particular between 30 seconds and 2 minutes. In the RTA process the semiconductor body 100 may be heated using a lamp or a laser. According to another example, the annealing process is a furnace process so that the semiconductor body is placed in a furnace during the annealing process. A temperature in this annealing process may be selected from a range of between 750° C. and 950° C., in particular between 800° C. and 900° C., and a duration of this annealing process may be selected from a range of between 2 minutes and 90 minutes, in particular between 5 minutes and 60 minutes.

The barrier layer 31 prevents the recombination center particles from diffusing out of the semiconductor body 100 via the contact electrode 30 that includes the barrier layer 31 and the contact layer 32.

Referring to FIG. 1D, forming the contact electrode 30 further includes forming an electrode layer 32 of an electrically conducting material on the barrier layer 31. According to one example, the electrode layer 31 includes at least one of a tungsten (W) layer, an aluminum (Al) layer, a copper (Cu) layer, an aluminum copper alloy (AlCu) layer, a polysilicon (Si) layer, or an aluminum silicon copper alloy (AlSiCu) layer. According to another example, forming the electrode layer 32 includes forming at least two sub-layers one above the other on the barrier layer 31. According to one example (illustrated in dashed lines in FIG. 1D) forming the electrode layer 32 includes forming a first sub-layer $32_1$ on the barrier layer 31 and a second sub-layer $32_2$ on the first sub-layer $32_1$. According to one example, the first sub-layer $32_1$ includes tungsten (W) or polysilicon (Si) and the second sub-layer includes one of copper (Cu), an aluminum copper alloy (AlCu), or an aluminum silicon copper alloy (AlSiCu). This, however, is only an example. Other types of sub-layers and more than two sub-layers may be used as well. Forming each of the first sub-layer $32_1$ and the second sub-layer $32_2$ may include a physical or a chemical deposition process.

In the example explained with reference to FIGS. 1A to 1D, the annealing process takes place after the barrier layer 31 has been formed but before the electrode layer 32 is formed. This process sequence may be used, for example, if the electrode layer 32 does not withstand the temperatures used in the annealing process. Nevertheless, the annealing process may be performed after the electrode layer 32 has been formed, if the electrode layer 32 is configured to withstand the temperatures in the annealing process.

According to yet another example (not shown), the annealing process is performed before the barrier layer 31 is formed. In this case an oxide layer may be formed on those sections of the semiconductor body 100 that are uncovered in the contact hole 21, wherein the oxide layer prevents the recombination center particles from diffusing out of the semiconductor body 100 during the annealing process. According to one example, the oxide layer is a deposited layer such as a TEOS (tetraethoxysilane) based layer and the annealing takes place in an inert atmosphere such as a nitrogen containing atmosphere. According to another example, the annealing takes place in an oxidizing (oxygen containing) atmosphere so that the oxide layer forms at the beginning of the annealing process.

FIGS. 2A and 2B illustrate a modification of the method explained with reference to FIGS. 1A to 1D. Referring to FIG. 2A, this method includes forming a contact hole 110 in the first surface 101 of the semiconductor body 100. This contact hole 110 adjoins the contact hole 21 in the insulation layer 20. According to one example, the contact hole 110 in the semiconductor body 100 is formed by an etching process that uses the insulation layer 20 as an etch mask. In this process, the semiconductor body 100 is etched in those regions not covered by the insulation layer 20, that is, at the bottom of the contact hole 21. FIG. 24 illustrates the semiconductor body 100 after implanting the recombination center particles. According to one example, the contact hole 110 in the semiconductor body 100 is formed after the recombination center particles have been implanted into the end-of-range region 11. According to another example, the contact hole 110 in the semiconductor body 100 is formed before implanting the recombination center particles. In this example, the recombination center particles are implanted into the semiconductor body 100 via the contact hole in the insulation layer 20 and the contact hole 110 in the semiconductor body 100.

FIG. 29 shows the arrangement after diffusing the recombination center particles and forming the contact electrode 30 with the barrier layer 31 and the electrode layer 32. In this example, the contact electrode 30, in the former contact hole 110 on the semiconductor body 100, extends into the semiconductor body 100 and is electrically connected to the semiconductor body 100 at a bottom and at sidewalls of the contact hole 110.

FIGS. 3A to 3B illustrate another modification of the method explained with reference to FIGS. 1A to 1D. Referring to FIG. 34, this method includes forming a sacrificial layer 51 at least on the insulation layer 20 before implanting the recombination center particles. According to one example, the sacrificial layer 51 is an oxide layer formed by a deposition process. In the implantation process, recombination center particles are not only implanted via the contact hole 21 into the semiconductor body 100 but recombination center particles are also implanted into the sacrificial layer 51 on top of the insulation layer 20. The sacrificial layer 51 is at least partially removed after the implantation process. Removing the sacrificial layer 51 may include an etching process.

At least partially removing the sacrificial layer 51 after the implantation process also removes recombination center particles that have been implanted into the sacrificial layer 51. This reduces the amount of recombination center particles outside the semiconductor body 100 and, therefore, reduces the risk of contamination by these recombination center particles outside the semiconductor body 100. According to one example, a process that removes the sacrificial layer is controlled such that it completely removes the sacrificial layer and also an uppermost section of the insulation layer 20. In this way, recombination center particles that might have been implanted through the sacrificial layer 51 into an upper section of the insulation layer 20 are also removed. According to one example, this process is an etching process.

According to one example that is illustrated in dashed lines in FIG. 3A, the sacrificial layer 51 is not only formed on the insulation layer 20 but also on the first surface 101 of the semiconductor body 100 in the contact hole 21. In this example, the recombination centers are implanted into the first surface 101 of the semiconductor body 100 through the sacrificial layer. According to one example, the sacrificial layer 51 is formed to be thicker on the insulation layer 51 than in the contact hole 21, so as to widely avoid recombination center particles from being implanted through the sacrificial layer 51 into the insulation layer 20. Alternatively or additionally to making the sacrificial layer 51 thicker on top of the insulation layer 20 an uppermost layer of the insulation layer 20 is removed when removing the sacrificial layer 51, so as to at least partially remove recombination center particles that might have been implanted into the insulation layer 20.

FIG. 39 shows the semiconductor arrangement after removing the sacrificial layer 51. According to one example (as shown) the sacrificial layer 51 is removed before the annealing process. According to another example (not shown) the sacrificial layer 51 is removed after the annealing process. According to one example, the contact hole 110 is formed in the semiconductor body 100 after removing the sacrificial layer 51. This contact hole 110 is illustrated in dashed lines in FIG. 3B. According to another example (not shown) the contact hole 110 is formed before forming the sacrificial layer 51 and implanting the recombination center particles.

Figure 4B:
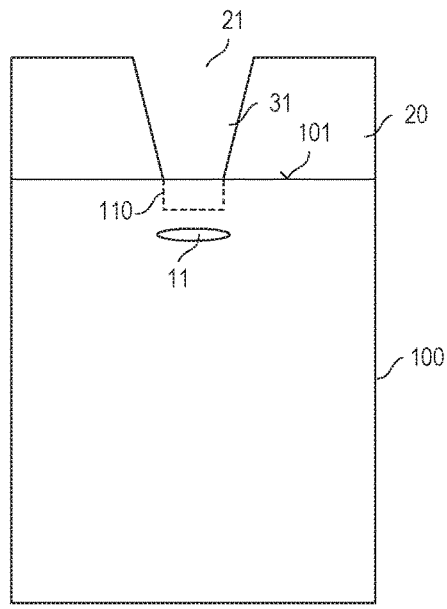

FIGS. 4A and 4B show another modification of the method explained with reference to FIGS. 1A to 1D. Referring to FIG. 4A, this method further includes forming an implantation mask 52 on top of the insulation layer 20 outside the contact hole 21. According to one example, the implantation mask 52 includes a photo resist, such as a negative photo resist. This implantation mask 52 is configured to prevent recombination center particles from being implanted into those regions of the insulation layer 20 covered by the implantation mask 52. This implantation mask 52 is removed after the implantation process. FIG. 4B shows the arrangement after the implantation process and after the implantation mask 52 has been removed. The implantation mask 52 may be removed before the annealing process, as shown in FIGS. 4A and 4B. As explained before, a contact hole 110 may be formed in the semiconductor body 100 after the implantation process. Forming such contact hole 110 after the implantation process is illustrated in dashed lines in FIG. 4B. According to another example (not shown) the contact hole 110 is formed before the implantation process.

Referring to FIG. 4A, the implantation mask 52 may be formed additionally to the sacrificial layer 51, whereas the sacrificial layer 51 may at least cover the sidewalls of the contact hole 21, which are not covered by the implantation mask 52.

Any of the methods explained above can be used to generate recombination centers and produce a contact electrode in various types of semiconductor devices. Different types of semiconductor devices in which recombination centers and a contact electrode 30 have been formed in accordance with one of the methods explained before are explained with reference to FIGS. 5 to 7 below. Each of these figures shows a vertical cross-sectional view of one section of a semiconductor device. Each of these semiconductor devices includes active device regions in the semiconductor body 100, wherein at least one of these active device regions is electrically connected to the contact electrode 30. The active device regions, which are not illustrated in the examples explained above, may be formed in the semiconductor body 100 before implanting the recombination center particles.

Figure 5:
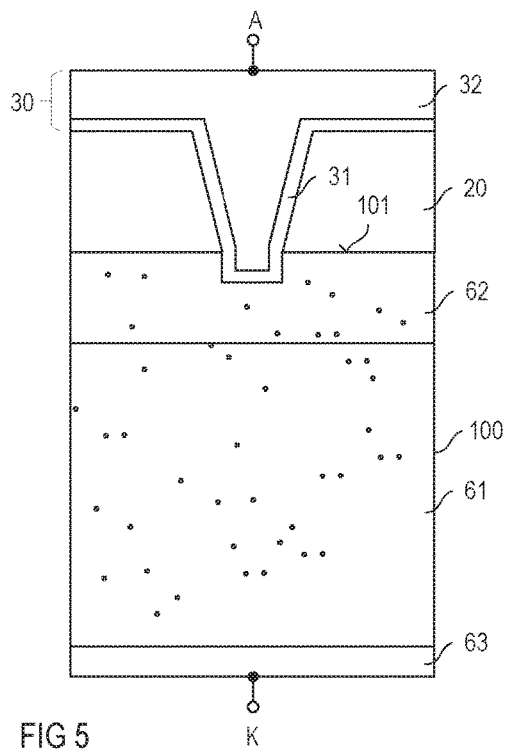
FIG. 5 illustrates a vertical cross-sectional view of one section of a diode that includes recombination centers and a contact electrode.

FIG. 5 shows a diode. This diode includes a base region 61 of a first doping type (conductivity type) and a first emitter region 62 of a second doping type complementary to the first doping type. The first emitter region 62 adjoins the base region 61 and forms a pn-junction with the base region 61. The contact electrode 30 is electrically connected to the first emitter region 62. The diode further includes a second emitter region 63 of the same doping type as the base region 61 but more highly doped than the base region 61. The second emitter region 63 is spaced apart from the first emitter region 62 and separated from the first emitter region 62 by the base region 61. In the example shown in FIG. 5, the second emitter region 63 is spaced apart from the first emitter region 62 in a vertical direction of the semiconductor body 100, which is a direction perpendicular to the first surface 101. According to one example, the base region 61 is an n-type region, the first emitter region 62 is a p-type region and the second emitter region 63 is an n-type region. In this example, the contact electrode 30 forms an anode or is connected to an anode A of the diode, and the second emitter region 63 is connected to a cathode K (which is only schematically illustrated in FIG. 5).

Figure 6:
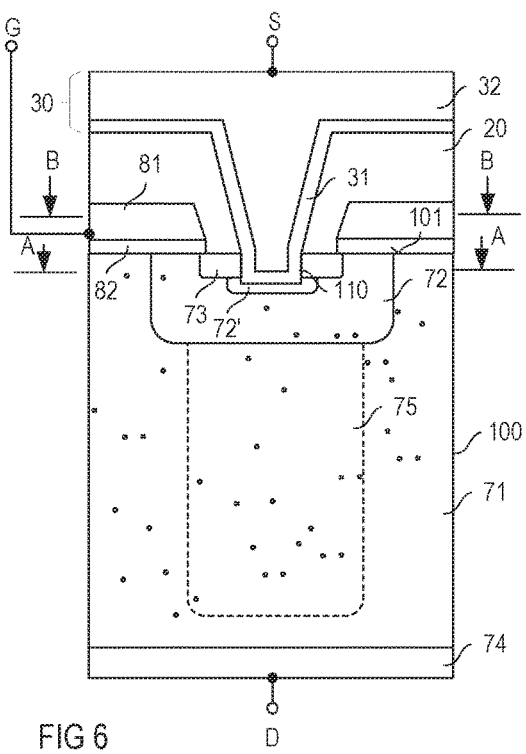
FIG. 6 illustrates a vertical cross-sectional view of one section of a MOSFET that includes recombination centers and a contact electrode.

FIG. 6 shows one example of a transistor device. This transistor device is implemented as a MOSFET. Active device regions of the MOSFET in the semiconductor body 100 include a drift region 71 of a first doping type, a body region 72 of a second doping type, a source region 73 of the first doping type, and a drain region 74 of the first doping type. The body region 72 adjoins the drift region 71 and forms a pn-junction with the drift region 71. The source region 73 is separated from the drift region 71 by the body region 72. The drain region 74 is spaced apart from the source region 73 and the body 72 and is separated from the body region 72 by the drift region 71. In the example shown in FIG. 6, the drain region 74 is spaced apart from the source region 73 in the vertical direction of the semiconductor body 100.

In this transistor device, contact electrode 30 forms a source electrode of the MOSFET and is electrically connected to both the source region 73 and the body regions 72. Optionally, the body region 72 includes a contact region 72' of the second doping type. This contact region 72' adjoins the contact electrode 30 and has a doping concentration high enough to form an ohmic contact between the contact electrode 30 and the contact region 72'. The drain region 74 is connected to a drain node 11) (which is only schematically illustrated in FIG. 6).

Referring to FIG. 6, the MOSFET further includes a gate electrode 81. The gate electrode 81 is adjacent the body region 72 and is dielectrically insulated from the body region 72, the source region 73 and the drift region 71 by a gate dielectric 82. In this example, the gate electrode 81 is arranged on top of the first surface 101. The gate electrode 81 is embedded in (covered by) the insulation layer 20 and electrically connected to a gate node G (which is only schematically illustrated in FIG. 6). Optionally, the MOSFET further includes a compensation region 75 of the second doping type. This compensation region 75 adjoins the body region 72 and the drift region 71 and is arranged between the body region 72 and the drain region 74 in this example.

Figure 7:
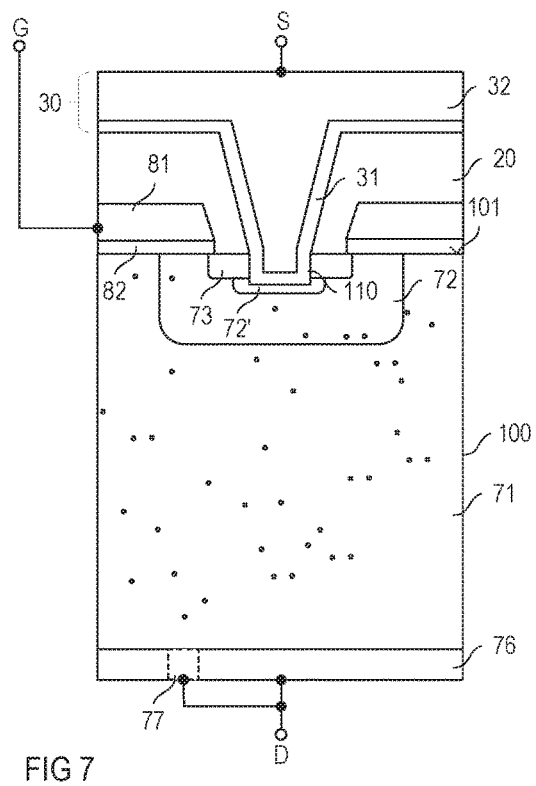
FIG. 7 illustrates a vertical cross-sectional view of one section of an IGBT that includes recombination centers and a contact electrode.

FIG. 7 shows another example of a transistor device. The transistor device shown in FIG. 7 is implemented as an IGBT. This IGBT is different from the MOSFET shown in FIG. 6 in that a drain region 76, which may also be referred to as collector region, has the second doping complementary to the doping type of the drift region 71. Optionally, one more emitter short regions 77 of the first doping type extend through the drain region 76 to or into the drift region 71 and are connected to the drain node D. An IGBT including those emitter short regions 77 can be referred to as reverse conducting (RC) IGBT. An IGBT without those emitter short regions 77 can be referred to as reverse blocking (RB) IGBT. Everything else that has been explained with reference to the MOSFET shown in FIG. 6 applies to the IGBT shown in FIG. 7 accordingly.

Each of the semiconductor devices explained with reference to FIGS. 5 to 7 can be operated in a bipolar conduction mode. The diode shown in FIG. 5 is in the bipolar conduction mode when a voltage is applied between the anode A and the cathode K that forward biases the pn-junction between the first emitter region 62 and the base region 61. In this bipolar conduction mode a charge carrier plasma with first type charge carriers and second type charge carriers forms in the base region 61. A concentration of this charge carrier plasma is dependent on a recombination rate of charge carriers in the base region 61, wherein this recombination rate can be affected by the recombination centers formed in the semiconductor body 100.

The MOSFET shown in FIG. 6 is in the bipolar conduction mode when a voltage is applied between the drain node D and the source node S such that the pn-junction between the body region 72 and the drift region 71 is forward biased. The bipolar diode formed by the body region 72 and the drift region 71 is also referred to as body diode. The IGBT shown in FIG. 7 is in the bipolar conduction mode when a voltage is applied between the drain node D and the source node S that reverse biases a pn-junction between the drain region 76 and the drift 71 and when a voltage is applied between the gate node G and the source node S that generates a conducting channel in the body region 72 between the source region 73 and the drift region 71.

FIGS. 6 and 7 only show one section of a MOSFET and a IGBT, respectively. Each of these transistor devices may include a plurality of transistor cells, with each transistor cell including a source region 73, a body region 72, a gate electrode 81 and a gate dielectric 82, a drift region 71 and a drain region 74 or 76. The plurality of transistor cells may share the drift region 71 and the drain region 74 and be connected to the drain node D. Two or more transistor cells may share one body region 72. The source regions 73 of the plurality of transistor cells are connected to the source node 5, and the gate electrodes 81 of the plurality of transistor cells are connected to the gate node G, so that the individual transistor cells are connected in parallel.

Figures 8A, 8B:
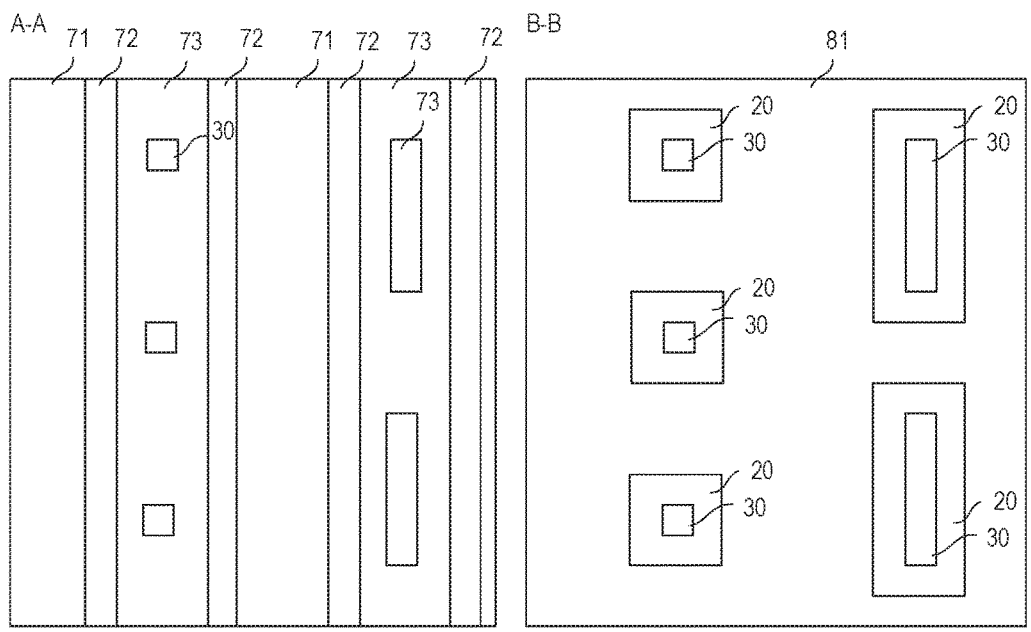
FIGS. 8A to 8B illustrate horizontal cross-sectional views in different section planes of a MOSFET of the type illustrated in FIG. 6.

According to one example, the body regions 72 and the source regions 73 of the individual transistor cells are elongated in a direction perpendicular to the section planes shown in FIGS. 6 and 7. This is illustrated in FIG. 8A that shows a horizontal cross sectional view of a MOSFET of the type shown in FIG. 6 and having a plurality of elongated body and source regions 72, 73. FIG. 8B shows a horizontal cross sectional view of this transistor device in a section plane B-B that cuts through the gate electrode 81. Referring to FIGS. 8A and 8B, along one elongated body region 73, there may be a plurality of contact holes extending into the body region 73. In this example (as shown in FIG. 8B) the gate electrode 81 is one planar electrode that includes a plurality of openings in which plugs of the contact electrode 30 extend through the gate electrode 81 into the body region 73, whereas these contact plugs are dielectrically insulated from the gate electrode 81 by sections of the insulation layer 20. Those plugs may be punctual as shown on the left side in FIGS. 8A and 8B or elongated as shown on the right side in FIGS. 8A and 8B.

FIGS. 9A to 9E illustrate a process sequence that may be used to form body regions 72, source regions 73, and the optional contact regions 72' and an insulation layer 20 with an embedded gate electrode 81 before implanting the recombination center particles. Each of FIGS. 9A to 9E illustrates a vertical cross-sectional view of one section of the semiconductor body 100. Referring to the above, the semiconductor body 100 may include a plurality of body regions 72 and optional compensation regions 75. In FIGS. 9A to 9E, however, only one body region 72 and only one optional compensation region 75 is shown. The body region 72 and the optional compensation region 75 may be formed in the semiconductor body 100 before forming the gate dielectric 82. Forming the body region 72 may include an implantation process in which dopant particles (dopant atoms) are implanted into the semiconductor body 100 via the first surface 101. According to one example, a layer of the semiconductor body 100 that includes the drift region 71, the optional compensation region 75 and the body region 72 is formed in a multi-epitaxial process. In this type of process, a plurality of epitaxial layers is grown one above the other on a substrate (that may form the drain region 74, 76 in the finished device) and dopant atoms are implanted into the individual epitaxial layers. In an annealing process, the implanted dopant atoms are activated.

Figure 9A:
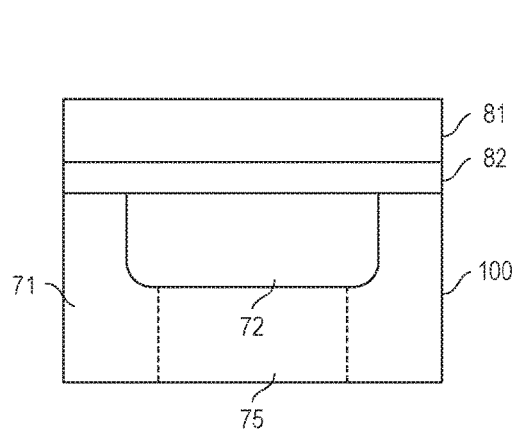
FIGS. 9A to 9E illustrate one example of a method for producing active device regions and a gate electrode of a transistor cell before forming recombination centers.

FIG. 9A shows the semiconductor arrangement after forming the drift region 71, the body region 72 and the optional compensation region 75 in the semiconductor body 100 and after forming the gate dielectric 82 on the first surface 101 of the semiconductor body 100 and the gate electrode 81 on the gate dielectric 82. According to one example, the gate dielectric 82 is an oxide. According to one example the oxide is a thermal oxide grown on the first surface 101 in a thermal oxidation process. The gate electrode 81, for example, is metal or a highly doped polycrystalline semiconductor material such a polysilicon. The gate electrode 81 may be formed on the gate dielectric 82 in a physical or chemical deposition process.

Figure 9B:
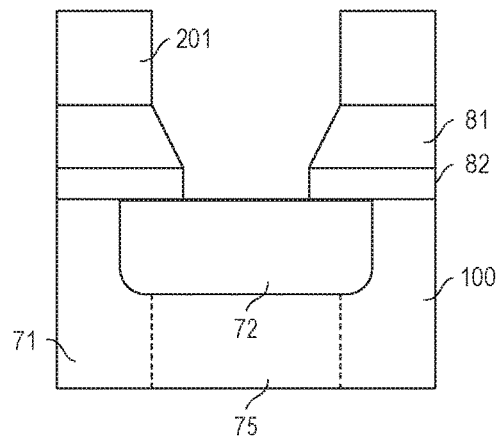

Referring to FIG. 9B, the gate electrode 81 and the gate dielectric 82 are patterned. "Patterning" the gate electrode 81 and the gate dielectric 82 includes forming at least one contact hole in the gate electrode 81 and the gate dielectric 82 above the body region 72. This may include an etching process that etches the gate electrode 81 and the gate dielectric 82 in those regions not covered by an etch mask 201 formed on top of the gate electrode 81.

Figure 9C:
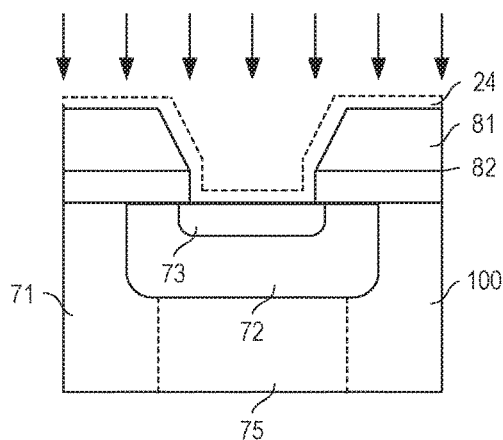

Referring to FIG. 9C, dopant atoms are implanted into the body region 72 using the gate electrode 81 and the gate dielectric 82 as an implantation mask. That is, dopant atoms are implanted only into those regions of the body region 72 not covered by the gate electrode 81 and the gate dielectric 82. The dopant atoms implanted in this process form the source region 73. In FIG. 9C, this source region 72 is drawn to have been completely formed. This, however, is only an example. Forming the source region 73, besides implanting the dopant atoms, includes an annealing process in which the implanted dopant atoms diffuse and are electrically activated. This annealing process is not necessarily performed directly after the implantation process. Instead, there may be one common annealing process that diffuses and activates the dopant atoms implanted to form the source region 73, but also other dopant atoms implanted to form other device regions, such as the contact region 72'. Optionally, before the implantation process, a protection layer 24 is formed on the gate electrode 81 and the first surface 101 of the semiconductor body 100. The dopant atoms are implanted through the protection layer into the body region 72. This protection layer 24 protects the gate electrode 81 in the annealing process. According to one example, the protection layer is a deposited oxide layer.

Figure 9D:
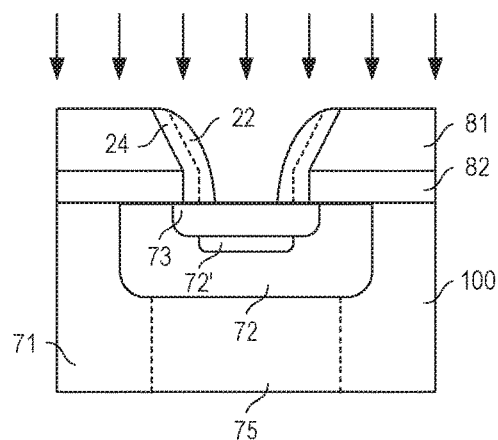

Referring to FIG. 9D the method further includes forming a spacer 22 on sidewalls of a contact hole formed by the gate electrode 81 and the gate dielectric 82. Using the gate electrode 81 and this spacer 22 as an implantation mask, dopant atoms of the same doping type as the body region 72 are implanted into the semiconductor body 100. These dopant atoms form the optional contact region 72' after the annealing process explained in context with FIG. 9C. Optionally, not only dopant atoms that form the contact region 72' but also additional dopant atoms that form the source region 73 are implanted after forming the spacer 22.

Forming the spacer may include depositing a spacer layer all over the gate electrode 81 and uncovered sections of the first surface 101 and anisotropically etching this spacer layer so that the spacer 22 remains. According to one example, the spacer layer is an oxide layer. Forming this oxide layer may include a deposition process.

Figure 9E:
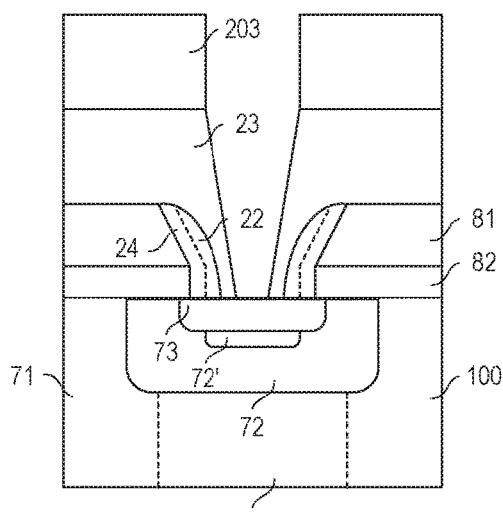

Referring to FIG. 9E an insulation layer 23 is formed on top of the gate electrode 81. This insulation layer 23, the spacer 22 and the optional scattering layer 24 together form the insulation layer 20. Furthermore, the contact hole 21 explained before is formed in the insulation layer 20. Forming the contact hole 21 may include an etching process using an etch mask 203 formed on top of the insulation layer 20.

Figure 10:
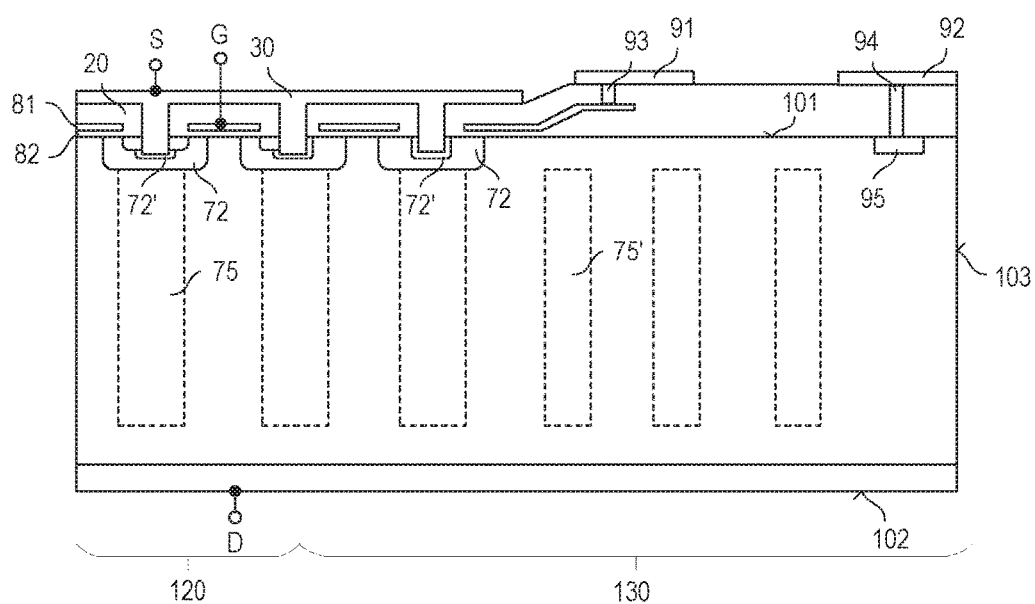
FIG. 10 shows a vertical cross-sectional view of one section of a transistor device in an edge region.

Referring to the above, a transistor device such as a MOSFET explained with reference to FIG. 6 or an IGBT explained with reference to FIG. 7 may include a plurality of transistor cells each including a body region 72, a source region 73 and an optional contact region 72'. Referring to FIG. 10, which shows a horizontal cross-sectional view of one section of a semiconductor arrangement that includes a transistor device, these transistor cells are arranged in an inner region of the semiconductor body 100. The inner region 120, in a horizontal plane not shown in FIG. 10, is surrounded by an edge region 130, whereas the edge region is a region between the inner region 120 and an edge surface 103 of the semiconductor body 100. FIG. 10 shows the edge region 130 and one section of the inner region 120.

The edge region 130 may include an edge termination structure. Referring to FIG. 10, the edge termination structure may include a first field ring 91 arranged on the insulation layer 20, spaced apart from the first surface 101, and electrically connected to the gate electrode 81 through an electrically connecting via 93. The edge termination structure may further include a second field ring 92 above the insulation layer 20, spaced apart from the first surface, 101 and electrically connected to the drift region 71 through a via 94 and an optional contact region 95 of the same doping type as the drift region 71 but more highly doped. The edge region may further include modified transistor cells that include a body region 72 and an optional contact region 72', but that do not include a source region. The body region of this modified transistor cell is also connected to the source electrode 30.

Referring to the above, implanting the recombination center particles may include forming an implantation mask (52 in FIG. 4A) on top of the insulation layer 20 before implanting the recombination center particles. Referring to FIG. 4A this implantation mask 52 may be formed on the insulation layer 20 close to the contact hole 21, so that in a device with a plurality of contact holes 21 sections of the mask layer 52 are arranged on top of the insulation layer 20 between the contact holes 21. According to one example, the mask is also formed on the insulation layer 20 above the edge region 130 shown in FIG. 10, so as to prevent recombination center particles from being implanted into the edge region 130. The implantation mask may be formed such that recombination center particles are implanted or such that recombination center particles are not implanted into the contact holes of the modified transistor cells explained above.

According to one example, the implantation mask is formed such that it covers some of the plurality of the contact holes of the (not modified) transistor cells so that recombination center particles are not implanted into each contact hole. According to one example, those contact holes covered by the implantation mask are located close to the edge region 130.

The field electrodes 91, 92 shown in FIG. 10 may be formed in the same process in which a contact electrode 30 is formed, so that these field electrodes 91, 92 have not yet been formed when the recombination center particles are implanted, that is, when the optional mask layer 52 is formed on the insulation layer 20 to prevent recombination center particles from being implanted.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising: implanting recombination center particles into a semiconductor body via at least one contact hole in an insulation layer formed on top of the semiconductor body; forming a contact electrode electrically connected to the semiconductor body in the at least one contact hole; and annealing the semiconductor body to diffuse the recombination center particles in the semiconductor body, wherein forming the contact electrode comprises forming a barrier layer on sections of the semiconductor body uncovered in the at least one contact hole, wherein the barrier layer is configured to inhibit the recombination center particles from diffusing out of the semiconductor body, wherein the barrier layer comprises at least one layer, and wherein the at least one layer comprises at least one of titanium (Ti), titanium nitride (TiN), tantalum (Ta), tantalum nitride (TaN), titanium tungsten alloy (TiW), and titanium tungsten nitride (TiWN).

2. The method of claim 1, wherein forming the contact electrode further comprises:
forming at least one electrode layer on the barrier layer.

3. The method of claim 2, wherein the annealing occurs after forming the barrier layer and before forming the at least one electrode layer.

4. The method of claim 2, wherein the at least one electrode layer comprises a material selected from the group consisting of:
tungsten (W);
an aluminum copper alloy (AlCu); and
an aluminum silicon copper alloy (AlSiCu).

5. The method of claim 1, wherein the annealing occurs before forming the barrier layer.

6. The method of claim 1, further comprising:
forming a sacrificial layer at least on the insulation layer before implanting the recombination center particles; and
removing the sacrificial layer before forming the contact electrode.

7. The method of claim 6, wherein forming the sacrificial layer comprises forming the sacrificial layer on the insulation layer and on the semiconductor body in the contact hole.

8. The method of claim 6, wherein the sacrificial layer comprises an oxide layer.

9. The method of claim 1, further comprising:
forming an implantation mask on the insulation layer before implanting the recombination center particles; and
removing the implantation mask after implanting the recombination center particles.

10. The method of claim 1, wherein the semiconductor body comprises a contact hole adjoining the at least one contact hole in the insulation layer, and wherein the recombination center particles are implanted into the contact hole of the semiconductor body.

11. The method of claim 1, further comprising:
after implanting the recombination center particles and before forming the contact electrode, forming a contact hole in the semiconductor body adjoining the at least one contact hole in the insulation layer.

12. The method of claim 11, wherein forming the contact hole in the semiconductor body comprises etching the semiconductor body using the insulation layer as an etch mask.

13. The method of claim 1, wherein the semiconductor body comprises:
a drift region of a first doping type:
a body region of a second doping type complementary to the first doping type and adjoining the drift region; and
a source region of the first doping type separated from the drift region by the body region,
wherein forming the contact electrode comprises forming the contact electrode to be connected to the source region and the body region.

14. The method of claim 13, wherein the semiconductor body further comprises a drain region of the first doping type that is more highly doped than the drift region and separated from the body region by the drift region.

15. The method of claim 13, wherein the semiconductor body further comprises a collector region of the second doping type that is more highly doped than the drift region and separated from the body region by the drift region.

16. The method of claim 1, wherein the semiconductor body comprises:
a base region of a first doping type; and
a first emitter region of a second doping type complementary to the first doping type, wherein forming the contact electrode comprises forming the contact electrode to be electrically connected to the first emitter region.

17. The method of claim 1, wherein annealing the semiconductor body comprises an RTA process.

18. The method of claim 1, wherein annealing the semiconductor body comprises a furnace process.

19. The method of claim 1, wherein the recombination center particles comprise atoms or ions of one or more chemical elements selected from the group consisting of:
platinum (Pt);
gold (Au);
palladium (Pd);
iridium (Ir);
silver (Ag);
copper (Cu);
mercury (Hg); and
rhenium (Re).

20. A method, comprising: implanting recombination center particles into a semiconductor body via at least one contact hole in an insulation layer formed on top of the semiconductor body; forming a contact electrode electrically connected to the semiconductor body in the at least one contact hole; and annealing the semiconductor body to diffuse the recombination center particles in the semiconductor body, wherein forming the contact electrode comprises forming a barrier layer on sections of the semiconductor body uncovered in the at least one contact hole, wherein the barrier layer is configured to inhibit the recombination center particles from diffusing out of the semiconductor body, wherein the recombination center particles comprise atoms or ions of one or more chemical elements selected from the group consisting of: platinum (Pt); gold (Au); palladium (Pd); iridium (Ir); silver (Ag); copper (Cu); mercury (Hg); and rhenium (Re).

* * * * *